US012607944B2

(12) United States Patent
Cho et al.

(10) Patent No.:  US 12,607,944 B2
(45) Date of Patent:      Apr. 21, 2026

(54) EXTREME ULTRAVIOLET SOURCE CLEANING APPARATUS, EUV SOURCE CLEANING METHOD USING THE SAME, AND SUBSTRATE PROCESSING METHOD INCLUDING THE SAME

(71) Applicant: SAMSUNG ELECTRONICS CO., LTD., Suwon-si (KR)

(72) Inventors: Chulmin Cho, Suwon-si (KR); Youngduk Suh, Suwon-si (KR); Kyoungwhan Oh, Suwon-si (KR); Sanghyun Lim, Suwon-si (KR); Youngkyun Im, Suwon-si (KR); Jaehong Lim, Suwon-si (KR); Dohyun Jung, Suwon-si (KR); Seok Heo, Suwon-si (KR); Youngho Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 110 days.

(21) Appl. No.: 18/599,673

(22) Filed: Mar. 8, 2024

(65)              Prior Publication Data

US 2025/0076775 A1      Mar. 6, 2025

(30)          Foreign Application Priority Data

Sep. 4, 2023      (KR) ........................ 10-2023-0117203

(51) Int. Cl.
G03F 7/00                  (2006.01)

(52) U.S. Cl.
CPC ...... G03F 7/70916 (2013.01); G03F 7/70033 (2013.01); G03F 7/70925 (2013.01); G03F 7/70975 (2013.01)

(58) Field of Classification Search
CPC ............. G03F 7/70916; G03F 7/70033; G03F 7/70925; G03F 7/70975; G03F 7/20;
(Continued)

(56)              References Cited

U.S. PATENT DOCUMENTS 8,075,732 B2    12/2011  Partlo et al.
8,083,858 B2    12/2011  Pulliainen
(Continued)

FOREIGN PATENT DOCUMENTS

JP              6615765 B2      12/2019
KR          10-1217062 B1      12/2012
(Continued)

OTHER PUBLICATIONS

Yuanbo Zhang et al., Sodium stannate preparation from stannic oxide by a novel soda roasting—leaching process, Hydrometallurgy 146 (2014) 82-88.
(Continued)

*Primary Examiner* — Christina A Riddle
(74) *Attorney, Agent, or Firm* — Morgan, Lewis & Bockius LLP

(57)              ABSTRACT

A substrate processing method, comprising: using an exposure apparatus to process a substrate; and cleaning an extreme ultraviolet (EUV) source of the exposure apparatus, wherein cleaning an extreme ultraviolet (EUV) source comprising: spraying a cleaning solution on an inner surface of a housing of an EUV source; cleaning the inner surface of the housing; and aspirating a material produced from the cleaning of the inner surface of the housing, wherein the housing includes an internal space defined by the inner surface of the housing, wherein the internal space becoming narrower in a first direction, and wherein the cleaning solution includes sodium hydroxide (NaOH).

20 Claims, 12 Drawing Sheets

(58) Field of Classification Search

CPC .......... G03F 7/70175; G03F 9/00; G03F 1/24; G03F 1/82; G03F 7/70008; G03F 7/70616; G03F 7/70733; G03F 7/70866; G03F 7/708; G03F 7/70808; G03F 7/70816; G03F 7/70825; G03F 7/70833; G03F 7/70841; G03F 7/7085; G03F 7/70858; G03F 7/70883; G03F 7/70891; G03F 7/70933; G03F 7/70941; G03F 7/7095; G03F 7/70958; G03F 7/70983; G03F 7/70908–70991; B08B 1/12; B08B 1/165; B08B 3/02; B08B 3/08; B08B 7/00; B08B 9/0322; B08B 9/0553; B08B 7/0028; B08B 7/0021; B08B 9/027; B08B 9/032; B08B 9/053; B08B 9/055; B08B 7/0071; B08B 2220/01; B08B 5/00; B08B 7/0035; B08B 7/0042; B08B 7/04; B08B 9/00; B08B 9/087; B08B 3/04; B08B 3/044; B08B 3/10; B08B 3/102; B08B 3/12; C11D 7/06; C11D 2111/22; C11D 3/37; C11D 3/3947; C11D 7/10; C11D 2111/16; C11D 7/32; C11D 9/00; C11D 9/02; C11D 9/007; C11D 3/24; C11D 3/34; C11D 3/044; C11D 3/04; C11D 3/1213; C01B 21/072; C01F 7/00; C08J 2329/04; C08J 2367/00; C08J 2377/00; C08J 2379/04; C08J 7/06; C22C 2200/00; C23C 16/0227; C23C 16/34; C30B 25/18; C30B 25/186; C30B 29/403; C30B 29/68; C30B 33/10; F41A 29/00; F41A 29/02; H01L 21/02024; H01L 21/02052; H01L 21/0206; H01L 21/02096; H01L 21/02178; H01L 21/02271; H01L 21/02389; H01L 21/0254; H01L 21/02576; H01L 21/0262; H01L 21/02658; H01L 21/31053; H01L 21/67028; H01L 21/02057; H01L 21/67034; H01L 21/67051; H01L 21/67207; H01L 21/67225; H01L 21/02041; H01L 21/02101; H01L 21/304; H01L 21/31133; H01L 21/461; H01L 21/6704; H01L 21/6708; H01L 21/67161; B82Y 10/00; G21K 1/062; H01J 35/20; H01J 37/32862; G02F 1/3501; G02F 1/3505; G02F 1/353; G02F 1/3528; G02F 1/354; G02F 2203/26; H05G 2/005; H05G 2/00–0094

USPC ...................... 355/18, 27, 30, 52–55, 66–77; 250/492.1–493.1, 494.1, 503.1, 504 R, 250/505.1; 134/22.1, 22.11, 22.13, 22.17, 134/26, 29, 61–92, 117–121, 129–130, 134/166 R–169 C, 170, 171, 166 C, 134/172–201

See application file for complete search history.

(56) References Cited

U.S. PATENT DOCUMENTS

| | | | |
|---|---|---|---|
| 10,753,011 B2 | 8/2020 | Ariyuki | |
| 2007/0069162 A1* | 3/2007 | Banine ..................... | G03B 7/20 |
| | | | 250/504 R |
| 2008/0218709 A1* | 9/2008 | Van Vliet .................. | B08B 3/12 |
| | | | 355/30 |
| 2010/0025231 A1* | 2/2010 | Moriya ................ | H05G 2/0094 |
| | | | 204/298.31 |
| 2016/0207078 A1* | 7/2016 | Becker ................ | G03F 7/70841 |
| 2020/0146136 A1* | 5/2020 | Yu ........................ | G03F 7/70175 |
| 2020/0331038 A1* | 10/2020 | Wu ............................ | B08B 3/10 |
| 2021/0033990 A1* | 2/2021 | Lin .................... | G03F 7/70808 |
| 2022/0100101 A1* | 3/2022 | Tsai .................... | G03F 7/70841 |

FOREIGN PATENT DOCUMENTS

| | | |
|---|---|---|
| KR | 10-1632634 B1 | 6/2016 |
| KR | 10-1737944 B1 | 5/2017 |
| KR | 10-1843951 B1 | 3/2018 |

OTHER PUBLICATIONS

Gromov, D. G., & Gavrilov, S. A. (2011). Heterogeneous melting in low-dimensional systems and accompanying surface effects, IntechOpen, Nov. 13, 2010 Published: Sep. 15, 2011, pp. 158-190.

* cited by examiner

ES

HSh

HS

DS

COL

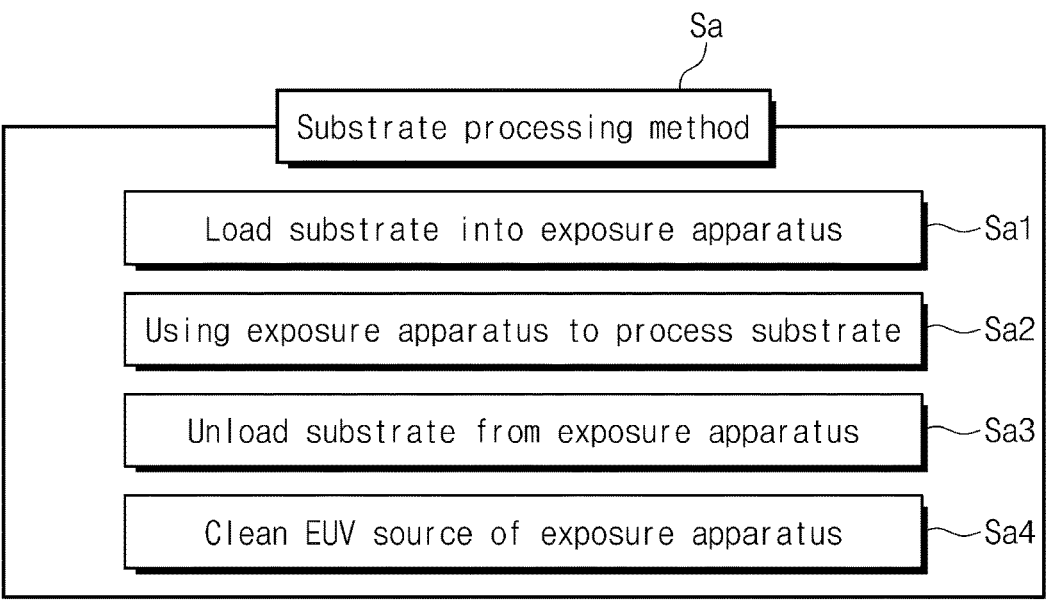

Sa

| Substrate processing method |
| --- |

Load substrate into exposure apparatus ~Sa1

Using exposure apparatus to process substrate ~Sa2

Unload substrate from exposure apparatus ~Sa3

Clean EUV source of exposure apparatus ~Sa4

FIG. 7

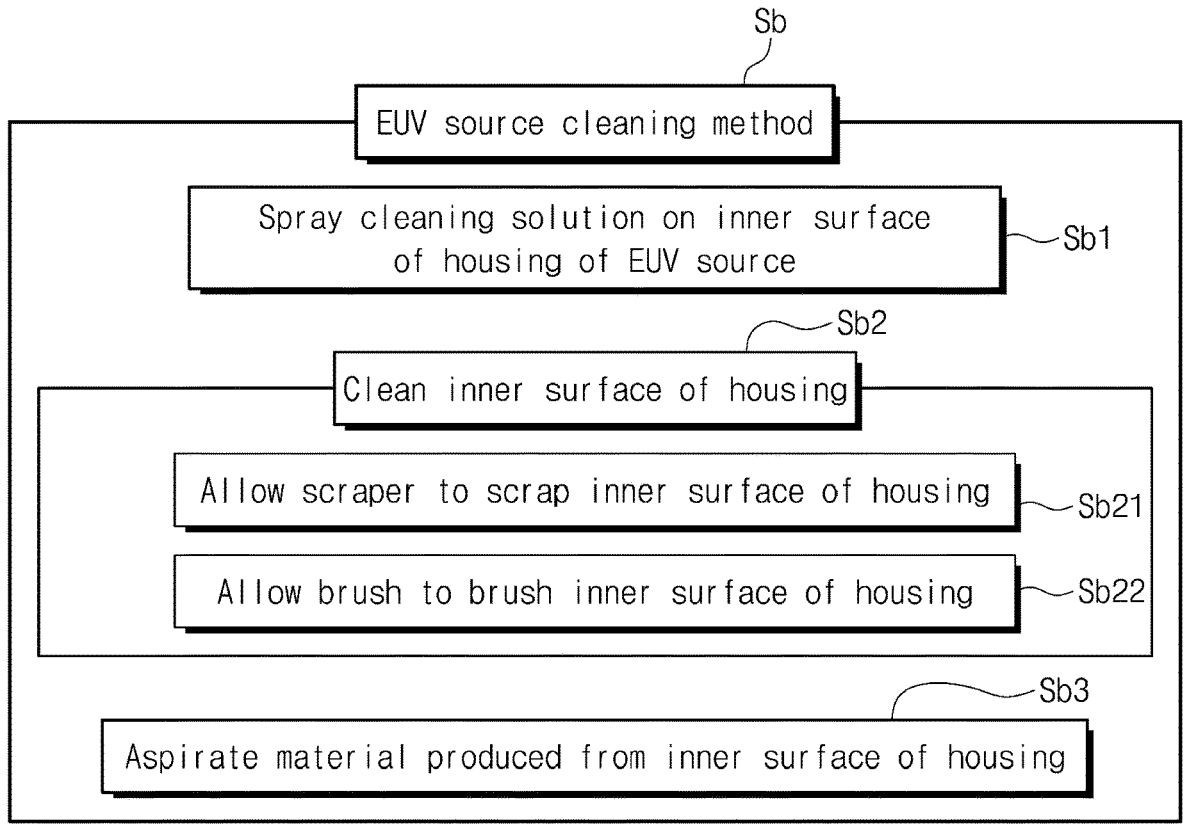

Sb

| EUV source cleaning method |
| --- |

Spray cleaning solution on inner surface of housing of EUV source ~Sb1

~Sb2
Clean inner surface of housing

Allow scraper to scrap inner surface of housing ~Sb21

Allow brush to brush inner surface of housing ~Sb22

~Sb3
Aspirate material produced from inner surface of housing

EXTREME ULTRAVIOLET SOURCE CLEANING APPARATUS, EUV SOURCE CLEANING METHOD USING THE SAME, AND SUBSTRATE PROCESSING METHOD INCLUDING THE SAME

CROSS-REFERENCE TO RELATED APPLICATION

This U.S. nonprovisional application claims priority under 35 U.S.C. § 119 to Korean Patent Application No. 10-2023-0117203, filed on Sep. 4, 2023, in the Korean Intellectual Property Office, the disclosure of which is incorporated by reference herein in its entirety.

TECHNICAL FIELD

The present disclosure relates to EUV cleaning and, more specifically, to an extreme ultraviolet source cleaning apparatus EUV source cleaning method using the same, and substrate process method including the same.

DESCRIPTION OF THE RELATED ART

Various processes may be employed when manufacturing a semiconductor device. For example, the semiconductor device may be manufactured through a photolithography process, an etching process, a deposition process, or a plating process. An extreme ultraviolet (EUV) source may be used to generate EUV radiation during an exposure process for fabricating a semiconductor device. During the exposure process, contaminants may accumulate on the EUV source.

SUMMARY

According to some embodiments of the present inventive concepts, a substrate processing method, comprising: using an exposure apparatus to process a substrate; and cleaning an extreme ultraviolet (EUV) source of the exposure apparatus, wherein cleaning an extreme ultraviolet (EUV) source comprising: spraying a cleaning solution on an inner surface of a housing of an EUV source; cleaning the inner surface of the housing; and aspirating a material produced from the cleaning of the inner surface of the housing, wherein the housing includes an internal space defined by the inner surface of the housing, wherein the internal space becoming narrower in a first direction, and wherein the cleaning solution includes sodium hydroxide (NaOH).

According to some embodiments of the present inventive concepts, a substrate processing method, comprising cleaning an extreme ultraviolet (EUV) source, wherein the cleaning an extreme ultraviolet (EUV source comprising: spraying a cleaning solution on an inner surface of a housing of an EUV source; cleaning the inner surface of the housing; and aspirating a material produced from the cleaning of the inner surface of the housing, wherein the housing includes an internal space defined by the inner surface of the housing, wherein the internal space becoming narrower in a first direction, and wherein the cleaning solution includes sodium hydroxide (NaOH).

According to some embodiments of the present inventive concepts, a substrate processing method including: loading a substrate into an exposure apparatus; using the exposure apparatus to process the substrate; unloading the substrate from the exposure apparatus; and cleaning extreme ultraviolet (EUV) source of the exposure apparatus. The exposure apparatus includes: the EUV source; an optical reflector that reflects EUV radiation generated from the EUV source; and a substrate stage that supports the substrate. Cleaning the EUV source includes: spraying sodium hydroxide (NaOH) on an inner surface of a housing of the EUV source; and cleaning the inner surface of the housing.

Details of other example embodiments are included in the description and drawings.

BRIEF DESCRIPTION OF THE DRAWINGS

FIG. 6 is a flow chart showing a substrate processing method according to some embodiments of the present inventive concepts.

FIG. 7 is a flow chart showing an EUV source cleaning method according to some embodiments of the present inventive concepts.

DETAILED DESCRIPTION OF THE EMBODIMENTS

Figure 1:
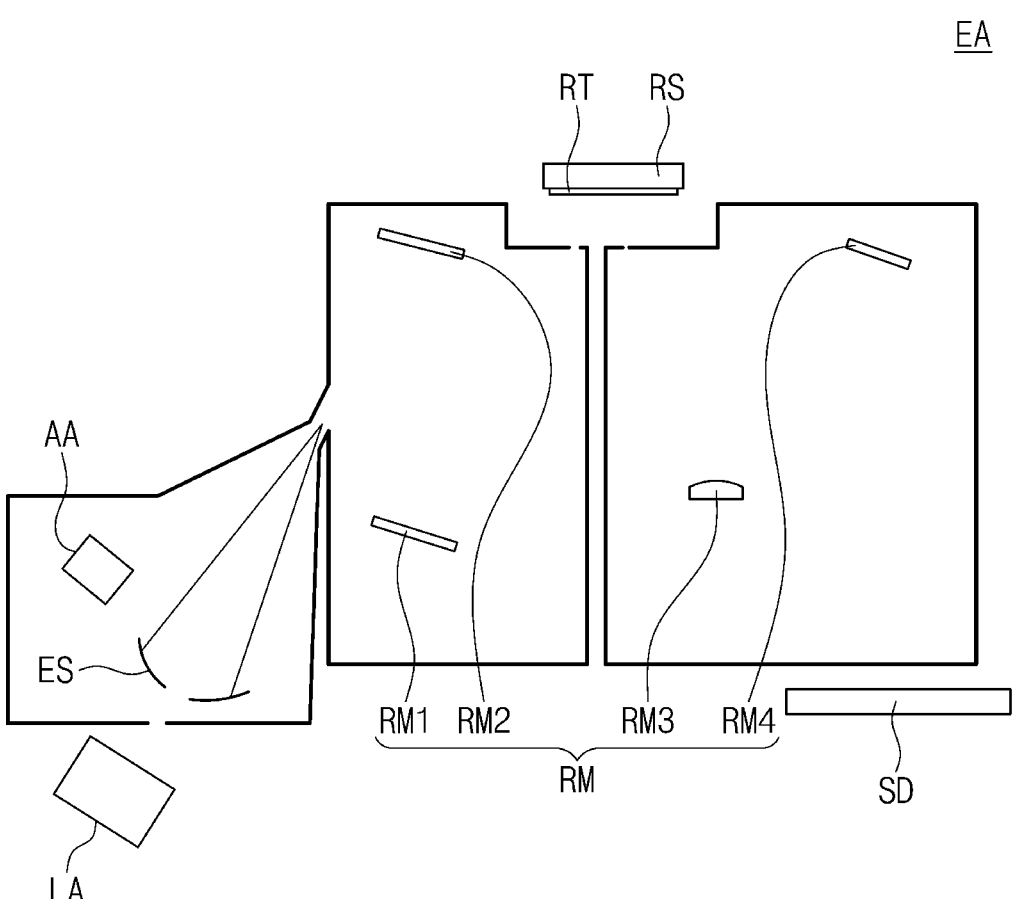
FIG. 1 is a schematic diagram showing an exposure apparatus according to some embodiments of the present inventive concepts.

The following will now describe some embodiments of the present inventive concepts with reference to the accompanying drawings. Like reference numerals may indicate like components throughout the description.

FIG. 1 is a schematic diagram showing an exposure apparatus according to some embodiments of the present inventive concepts.

Referring to FIG. 1, an exposure apparatus EA may be provided. The exposure apparatus EA may emit light to a substrate WF and form a pattern on the substrate WF. In this description, the term "substrate" may include a silicon (Si) wafer, but the present inventive concepts are not necessarily limited thereto. For example, the exposure apparatus EA may be configured to emit an extreme ultraviolet (EUV) radiation to a substrate WF and form a pattern on the substrate. The exposure apparatus EA may include an EUV source ES, an optical reflector RM, a reticle stage RS, and a substrate stage SD.

The EUV source ES may generate EUV radiation. The EUV source ES may include a housing (see HS of FIG. 2), a collector COL, a laser generator LA, and a fluid supply AA. The EUV source ES will be further discussed in detail below.

The optical reflector RM may guide a transit path of the EUV radiation generated from the EUV source ES. For example, the optical reflector RM may reflect the EUV radiation generated from the EUV source ES to guide the EUV radiation to a reticle RT and a substrate WF. The optical reflector RM may include a mirror and/or a lens. The optical reflector RM may be provided in plural. For example, as illustrated in FIG. 1, there may be a first optical reflector RM1, a second optical reflector RM2, a third optical reflector RM3, and a fourth optical reflector RM4. However, the numbers of optical reflector RM are not necessarily limited thereto. A single optical reflector RM will be discussed below in the interest of convenience.

The reticle stage RS may support the reticle RT. A pattern formed on the reticle RT on the reticle stage RS may be transferred to a substrate WF on the substrate stage SD.

The substrate stage SD may support a substrate WF. For example, a substrate WF may be disposed on the substrate stage SD. The substrate stage SD may hold a substrate WF in various ways. For example, the substrate stage SD may include an electrostatic chuck (ESC) in which an electrostatic force is used to hold a substrate WF. The present inventive concepts, however, are not necessarily limited thereto, and the substrate stage SD may hold a substrate WF by using one or more of a vacuum pressure and/or a clamp.

Figure 2:
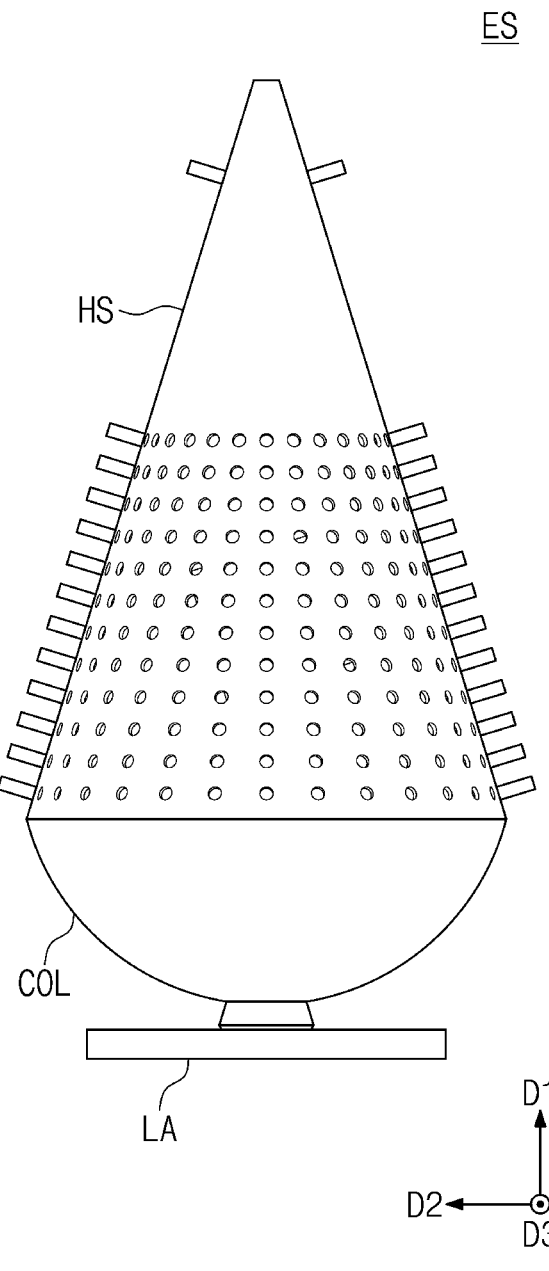
FIG. 2 is a front view showing an EUV source according to some embodiments of the present inventive concepts.
Figure 3:
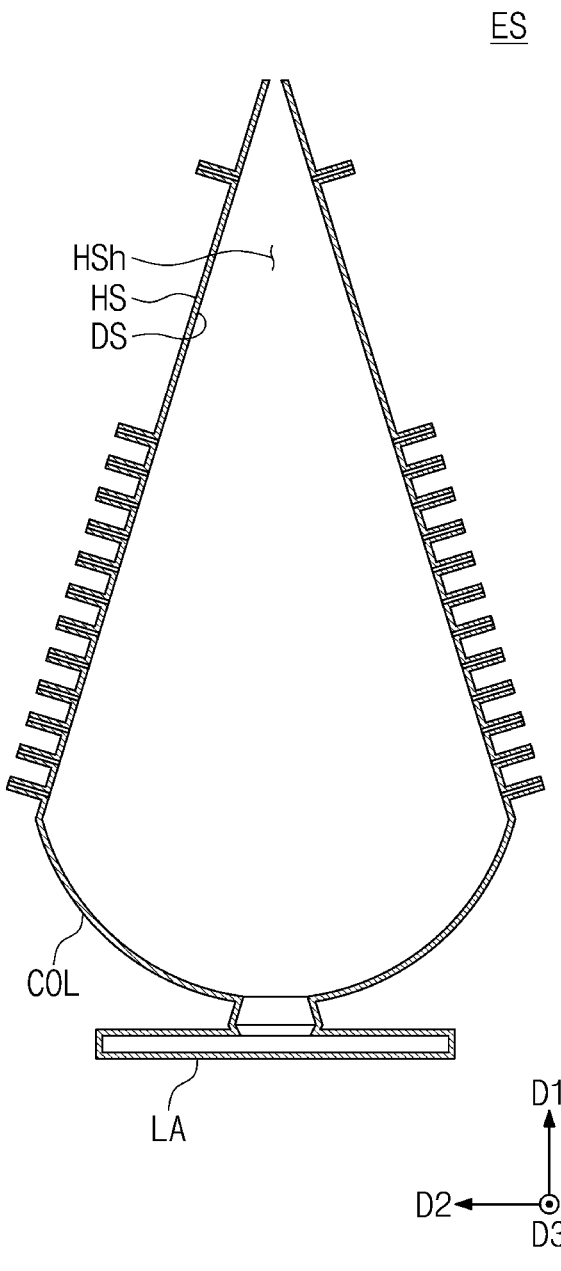
FIG. 3 is a cross-sectional view showing an EUV source according to some embodiments of the present inventive concepts.

FIG. 2 is a front view showing an EUV source according to some embodiments of the present inventive concepts. FIG. 3 is a cross-sectional view showing an EUV source according to some embodiments of the present inventive concepts.

In this description, symbol D1 may indicate a first direction, symbol D2 may indicate a second direction that intersects the first direction D1, and symbol D3 may indicate a third direction that intersects each of the first direction D1 and the second direction D2. The first direction D1 may be called an upward direction. In addition, each of the second and third directions D2 and D3 may be called a horizontal direction.

Referring to FIGS. 2 and 3, a housing HS may provide an internal space HSh. The internal space HSh may refer to an inner surface DS of the housing HS. The internal space HSh may become narrower along the first direction D1. For example, the internal space HSh may have a diameter that decreases in the first direction D1. For example, the diameter of the internal space HSh may linearly decrease in the first direction D1. The housing HS may have an open top end.

The collector COL may connect with the housing HS. For example, the collector COL may be combined with a bottom end of the housing HS. The collector COL may have a top surface exposed to the internal space HSh. For example, the top surface of the collector COL may be in contact with the bottom surface of the housing HS. The top surface of the collector COL may include, for example, a mirror surface. The top surface of the collector COL may have a partial spherical shape, for example, a semi sphere. The collector COL may cause that EUV radiation generated in the housing HS is concentrated on a certain side. A detailed description thereof will be further discussed below.

The laser generator LA may be connected to the housing HS. The laser generator LA may provide a laser beam to the internal space HSh.

The fluid supply AA may be connected to the housing HS. The fluid supply AA may provide fluid to the internal space HSh.

Figure 4:
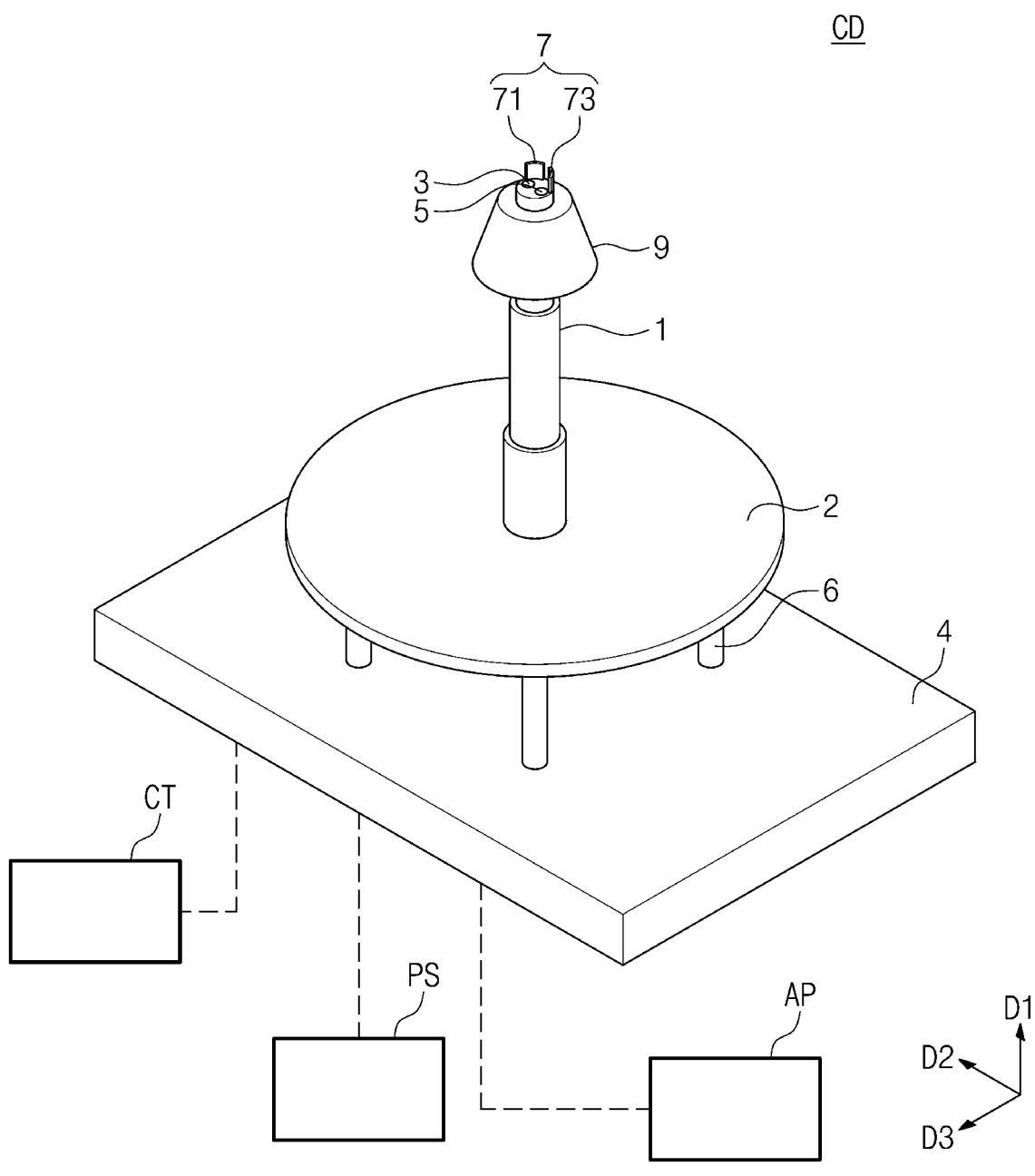
FIGS. 4 and 5 are perspective views showing an EUV source cleaning apparatus according to some embodiments of the present inventive concepts.
Figure 5:
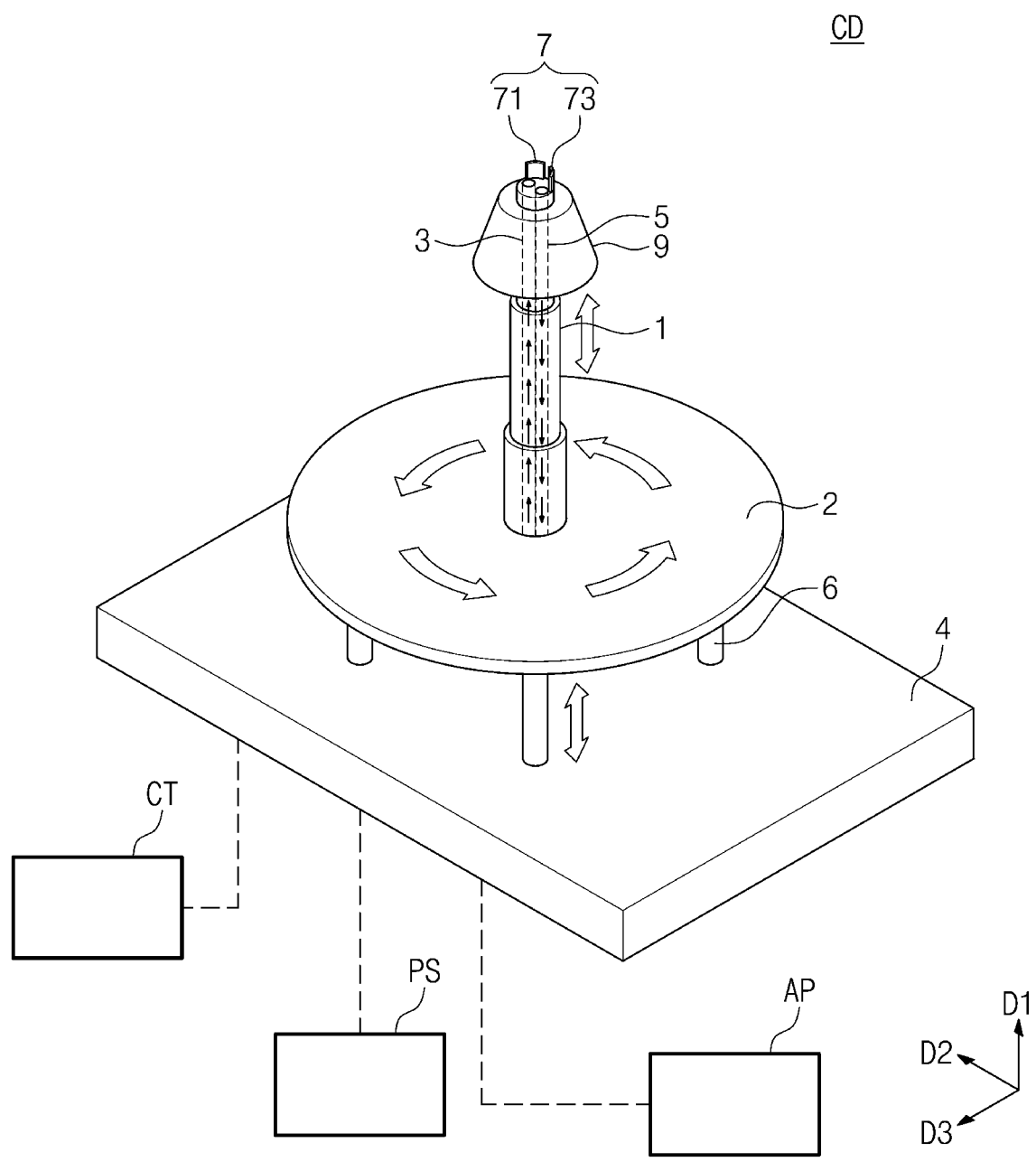

FIGS. 4 and 5 are perspective views showing an EUV source cleaning apparatus according to some embodiments of the present inventive concepts.

Referring to FIGS. 4 and 5, an EUV source cleaning apparatus CD may be provided. The EUV source cleaning apparatus CD may clean the EUV source ES. For example, the EUV source cleaning apparatus CD may clean the inner surface DS of the housing HS included in the EUV source ES. The EUV source cleaning apparatus CD may include a support bar 1, a spray nozzle 3, an aspiration line 5, a scraper 7, a brush 9, a prevention plate 2, a base stage 4, a height adjustment device 6, a cleaning solution tank CT, and a power supply PS, and an aspiration pump AP.

The support bar 1 may support the brush 9. The support bar 1 may extend vertically. For example, the support bar 1 may extend in the first direction D1. The support bar 1 may have a cylindrical shape, but the present inventive concepts are not necessarily limited thereto.

The spray nozzle 3 may spray a cleaning solution. The cleaning solution may include, for example, sodium hydroxide (NaOH). The spray nozzle 3 may be connected to the cleaning solution tank CT and the support bar 1. For example, the spray nozzle 3 may be supported by the support bar 1. The spray nozzle 3 may penetrate the support bar 1. For example, the spray nozzle 3 may have a tubular shape that penetrates in the first direction D1 through the support bar 1. The present inventive concepts, however, are not necessarily limited thereto, and the spray nozzle 3 may have any other suitable shapes.

The aspiration line 5 may aspirate one or more of a fluid and/or a solid. The aspiration line 5 may be connected to the aspiration pump AP. The aspiration line 5 may be spaced apart from the spray nozzle 3. The aspiration line 5 may be combined with the support bar 1. The aspiration line 5 may be supported by the support bar 1. The aspiration line 5 may penetrate the support bar 1. For example, the aspiration line 5 may have a tubular shape that penetrates in the first direction D1 through the support bar 1. The present inventive concepts, however, are not necessarily limited thereto, and the aspiration line 5 may have any other suitable shapes.

The scraper 7 may be spaced apart from each of the spray nozzle 3 and the aspiration line 5. The scraper 7 may have a top end that is at a higher level than that of a top end of each of the spray nozzle 3 and the aspiration line 5. A pair of scrapers 7 may be used. For example, a first scraper 71 and a second scraper 73 may be provided. The pair of scrapers 7 may be spaced apart from each other. A single scraper 7 will be discussed below in the interest of convenience. The scraper 7 may include an electrically conductive material. The scraper 7 may be supplied with current. Thus, the scraper 7 may serve as an electrode. The scraper 7 may be connected to the power supply PS.

The brush 9 may be positioned below the top end of the scraper 7. The brush 9 may be supported by the support bar 1. The brush 9 may partially surround an upper portion of the support bar 1. For example, the brush 9 may be fixedly coupled to the support bar 1. The brush 9 may have a width that decreases in a direction from lower to upper portions thereof, but the present inventive concepts are not necessarily limited thereto.

The prevention plate 2 may be disposed below and at a distance from the brush 9. The prevention plate 2 may provide a through aperture that penetrates the support bar 1. The prevention plate 2 may have a disk shape which is a circular and flat shape as illustrated in FIG. 4, but the present inventive concepts are not necessarily limited thereto.

The base stage 4 may be disposed below and at a distance from the prevention plate 2. The base stage 4 may support the support bar 1. The support bar 1 may be rotatable with respect to the base stage 4. Thus, the brush 9 fixedly coupled to the support bar 1 may also be rotatable. The height adjustment device 6 may be positioned on the base stage 4. The base stage 4 and the prevention plate 2 may be connected through the height adjustment device 6. For example, a base surface of the height adjustment device 6 may be in contact with the base stage 4 and an upper surface of the height adjustment device may be in contact with the prevention plate 2.

The height adjustment device 6 may be positioned between the base stage 4 and the prevention plate 2. The height adjustment device 6 may adjust a position of the prevention plate 2 relative to the base stage 4. For example, a length of the height adjustment device 6 may be adjustable. The height adjustment device 6 may include an actuator such as a motor.

The cleaning solution tank CT may supply the cleaning solution to the spray nozzle 3. For example, the cleaning solution tank CT may supply the spray nozzle 3 with sodium hydroxide (NaOH). The cleaning solution tank CT may be connected to the spray nozzle 3. For example, the cleaning solution tank CT may be connected to a bottom end of the spray nozzle 3.

The power supply PS may be connected to the scraper 7, and apply a power to the scraper 7. Thus, a current may flow through the scraper 7.

The aspiration pump AP may be connected to the aspiration line 5 and provide a vacuum pressure. Therefore, the aspiration line 5 may aspirate a material thereon.

FIG. 6 is a flow chart showing a substrate processing method according to some embodiments of the present inventive concepts.

Referring to FIG. 6, a substrate processing method Sa may be provided. The substrate processing method Sa may be a way of exposing a substrate by using the exposure apparatus EA discussed with reference to FIGS. 1 to 3. The substrate processing method Sa may include loading a substrate into an exposure apparatus (Sa1), using the exposure apparatus to process the substrate (Sa2), unloading the substrate from the exposure apparatus (Sa3), and cleaning an EUV source of the exposure apparatus (Sa4).

FIG. 7 is a flow chart showing an EUV source cleaning method according to some embodiments of the present inventive concepts.

Referring to FIG. 7, an EUV source cleaning method Sb may be provided. The EUV source cleaning method Sb may be a way of performing the cleaning EUV source of the exposure apparatus (Sa4) among the substrate processing method Sa discussed with reference to FIG. 6. For example, the EUV source cleaning method Sb may be a way of cleaning the EUV source (see ES of FIG. 3) by using the EUV source cleaning apparatus CD discussed with reference to FIGS. 4 and 5. The EUV source cleaning method Sb may include spraying a cleaning solution on an inner surface of a housing included in an EUV source (Sb1), cleaning the inner surface of the housing (Sb2), and aspirating a material produced from the inner surface of the housing (Sb3).

The housing clean step Sb2 may include using a scraper to scrap the inner surface of the housing (Sb21) and using a brush to brush the inner surface of the housing (Sb22).

The substrate processing method Sa of FIG. 6 will be discussed below with reference to FIGS. 8 to 15.

FIGS. 8 to 11 are diagrams showing a substrate processing method according to the flow chart of FIG. 6.

Figure 8:
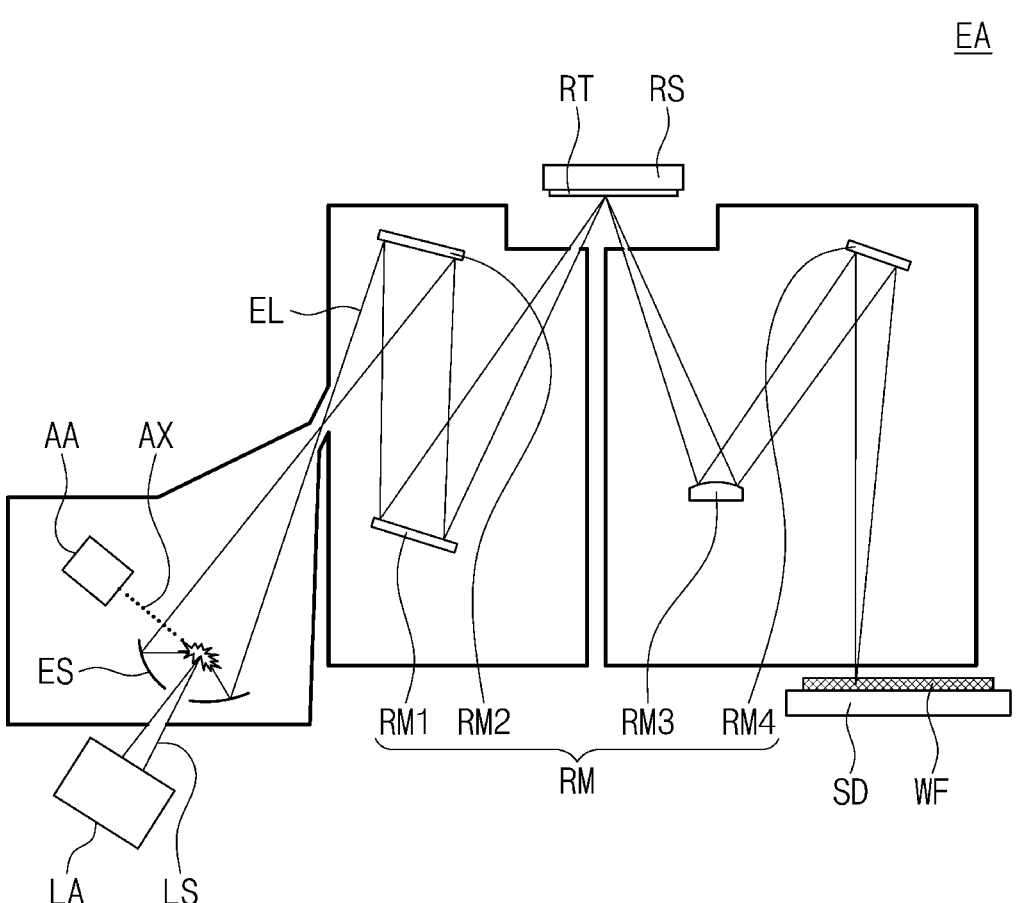
FIGS. 8, 9, 10 and 11 are diagrams showing a substrate processing method according to the flow chart of FIG. 6.

Referring to FIGS. 6 and 8, the substrate load step Sa1 may include placing a substrate WF on the substrate stage SD. The substrate WF may be held on the substrate stage SD.

Figure 9:
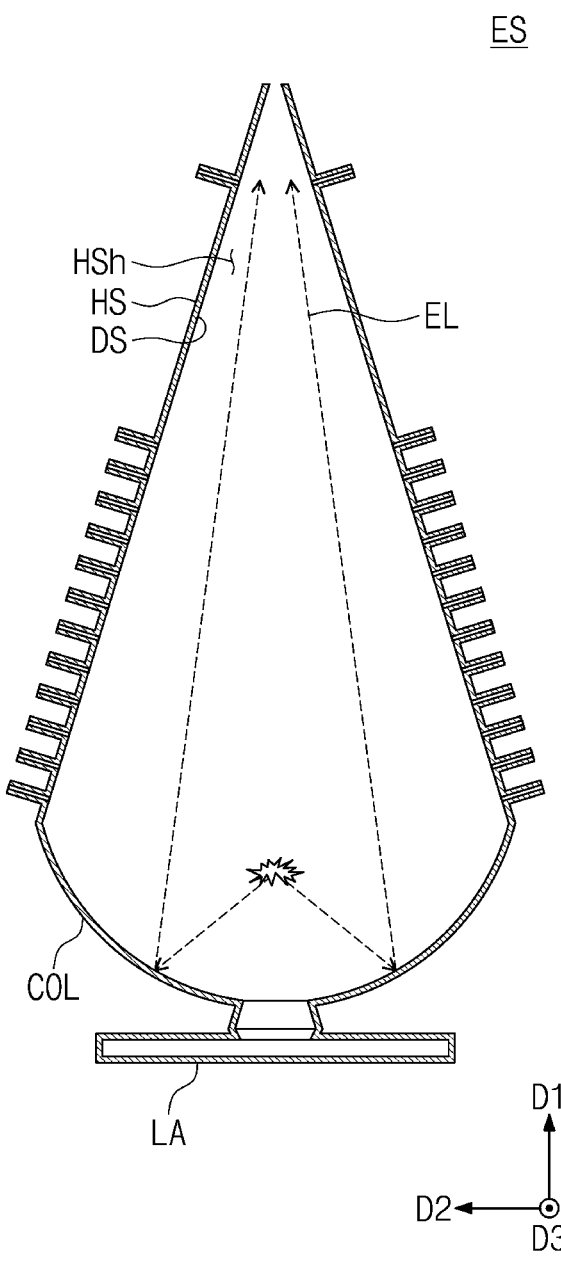

Referring to FIGS. 6, 8, and 9, the substrate process step Sa2 may include irradiating EUV radiation EL to the substrate WF on the substrate stage SD. For example, the substrate WF may receive the EUV radiation EL generated from the EUV source ES. The EUV source ES may generate the EUV radiation EL. The fluid supply AA may supply a fluid AX into the housing HS. The fluid AX may include a metal liquid of tin (Sn), xenon (Xe), titanium (Ti), and/or lithium (L), but the present inventive concepts are not necessarily limited thereto. The laser generator LA may emit a laser beam LS into the housing HS and generate the EUV radiation EL from the fluid AX. The EUV radiation EL may be reflected from the collector COL to discharge from the housing HS. The optical reflector RM may reflect the EUV radiation EL generated from the EUV source ES. The EUV radiation EL may be reflected from the reticle RT to travel to the substrate WF. Therefore, a pattern may be formed on the substrate WF.

The substrate unload step Sa3 may include removing the substrate WF, to which the EUV radiation EL is emitted, from the substrate stage SD.

Figure 10:
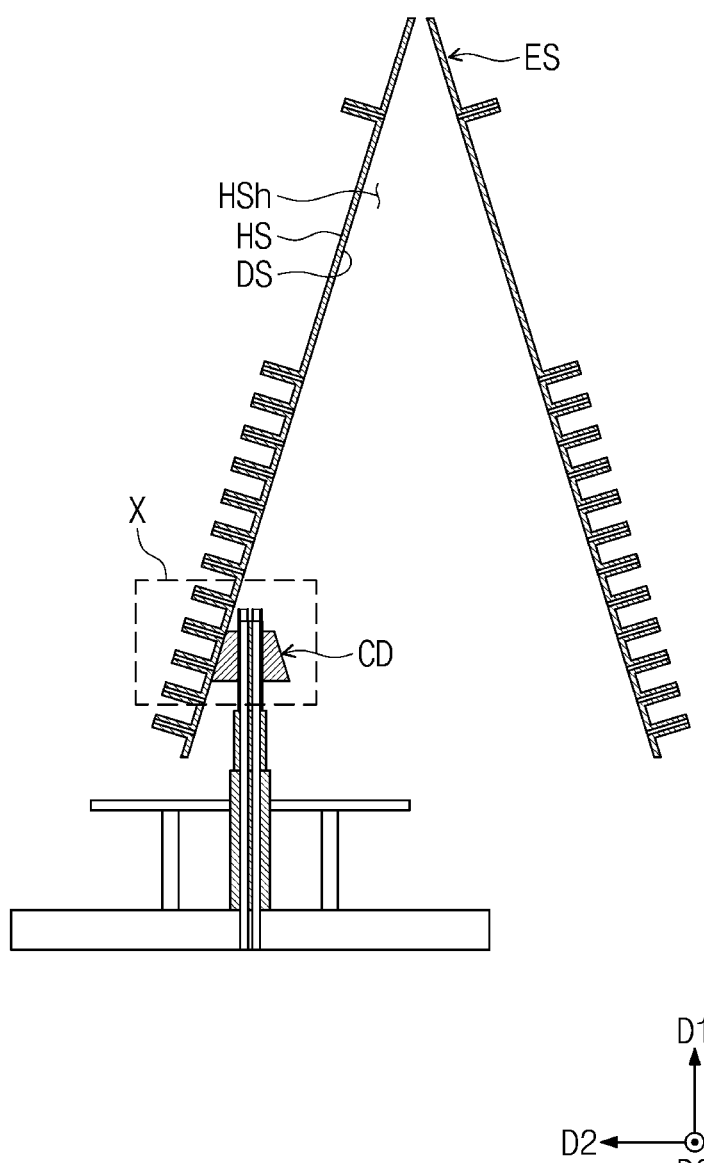
Figure 11:
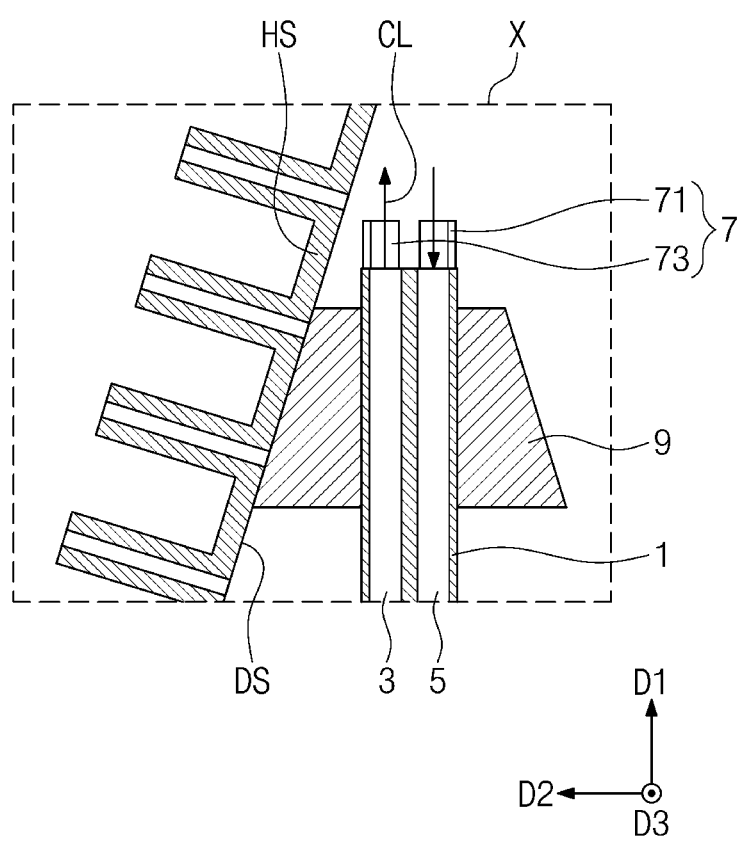

Referring to FIGS. 6, 10, and 11, the source clean step Sa4 may include using the EUV source cleaning apparatus CD to clean the housing HS of the EUV source ES. The EUV source cleaning apparatus CD may clean the inner surface DS of the housing HS. For example, the EUV source cleaning apparatus CD may eliminate tin (Sn) piled on the inner surface DS of the housing HS. The EUV source cleaning apparatus CD may spray a cleaning solution CL on the inner surface DS of the housing HS. The scraper 7, the brush 9, and the cleaning solution CL sprayed from the spray nozzle 3 may eliminate tin (Sn) from the housing HS, which tin is accumulated on the inner surface DS of the housing HS. A detailed description thereof will be further discussed below.

FIGS. 12 to 15 are diagrams showing an EUV source cleaning method according to the flow chart of FIG. 7.

Figure 12:
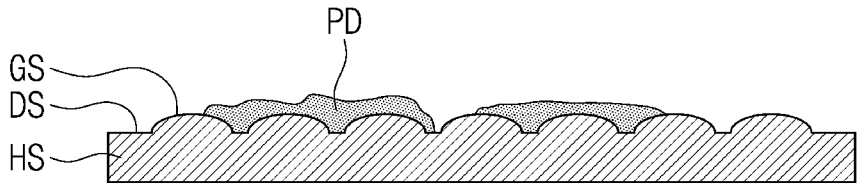
FIGS. 12, 13, 14 and 15 are diagrams showing EUV source cleaning method according to the flow chart of FIG. 7.

Referring to FIG. 12, a groove structure GS may be provided on the inner surface DS of the housing HS. A contaminant PD may be piled on the inner surface DS of the housing HS between the groove structure GS. For example, the contaminant PD may be tin (Sn) piled on the inner surface DS of the housing HS. The contaminant PD piled on the inner surface DS of the housing HS may be in a state of solid aggregation. For example, the contaminant PD may be stacked on the groove structure GS.

Figure 13:
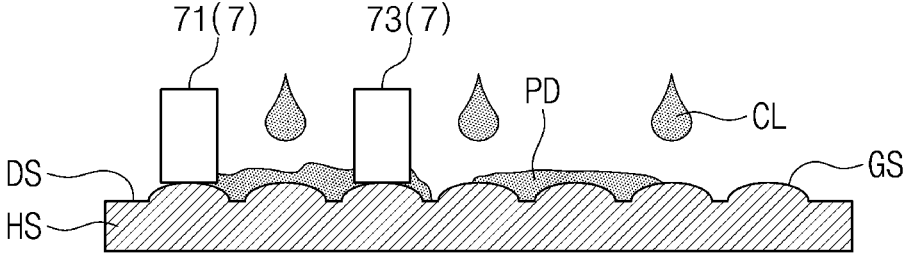

Referring to FIGS. 7, 11, and 13, the cleaning solution spray step Sb1 may include using the spray nozzle 3 to spray the cleaning solution CL supplied from the cleaning tank (see CT of FIG. 5) on the inner surface DS of the housing HS. The cleaning solution CL may include sodium hydroxide (NaOH). The cleaning solution CL sprayed on the inner surface DS of eth housing HS may react with the contaminant PD. For example, the sodium hydroxide (NaOH) in the cleaning solution CL may react with solid tin (Sn) in the contaminant PD and solid tin (Sn) may be converted to liquid as shown in the following equation.

$$Sn(s) + 2NaOH(l) + 4H_2O(l) = Na_2[Sn(OH)_6](l) + 2H_2(g)$$

In this procedure, a power may be applied to the scraper 7. For example, the power supply (see PS of FIG. 5) may supply the scraper 7 with a power such that a current may flow through one or more of the contaminant PD, the cleaning solution CL, and the housing HS. Therefore, the reaction between solid tin (Sn) and sodium hydroxide (NaOH) may be promoted.

Figure 14:
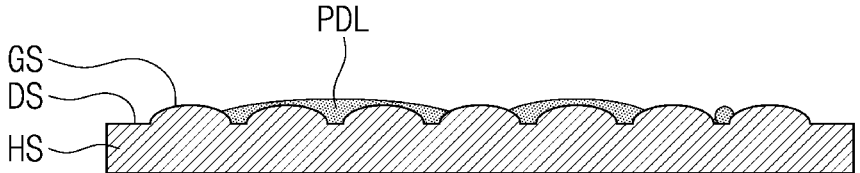

Referring to FIG. 14, a liquid contaminant PDL that is liquefied by sodium hydroxide (NaOH) may remain on the inner surface DS of the housing HS.

Referring back to FIGS. 7 and 13, the housing scrap step Sb21 may include using the scraper 7 to scrap the contaminant PD. For example, the scraper 7 may eliminate the contaminant PD, which is liquefied by sodium hydroxide (NaOH), from the inner surface DS of the housing HS.

Figure 15:
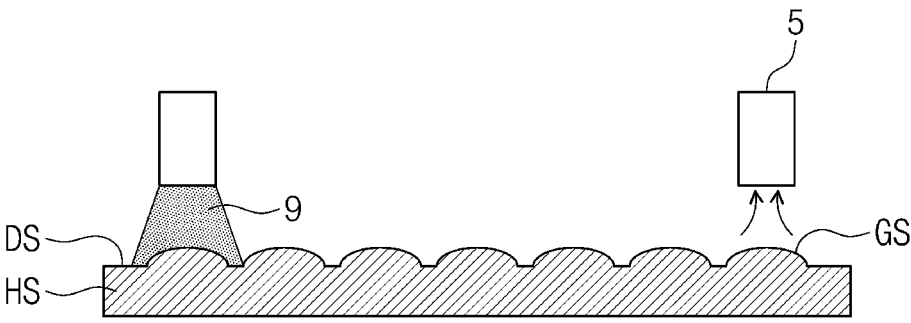

Referring to FIGS. 7 and 15, the housing brush step Sb22 may include moving the brush 9 to eliminate contaminants PD from the inner surface DS of the housing HS. In this step, the brush 9 may perform in a vertical motion. In some embodiments, the brush 9 may perform in a rotational motion. Therefore, contaminants PD may be eliminated from the inner surface DS of the housing HS.

The aspiration step Sb3 may include using the aspiration line 5 to aspirate contaminants PD. The aspiration line 5 may eliminate liquefied contaminants PDL from the inner surface DS of the housing HS. Accordingly, the housing HS may be cleaned.

According to an EUV source cleaning apparatus, an EUV source cleaning method using the same, and a substrate processing method including the same in accordance with some embodiments of the present inventive concepts, a cleaning solution may be used to clean an EUV source. For example, a sodium hydroxide (NaOH) solution may be used to melt and eliminate solid tin piled on a housing of the EUV source.

According to an EUV source cleaning apparatus, an EUV source cleaning method using the same, and a substrate processing method including the same in accordance with some embodiments of the present inventive concepts, contaminants PD piled on a housing may be liquefied and eliminated. Therefore, an EUV source may be prevented from being applied with an excessive physical force in a cleaning procedure. Accordingly, other components of the EUV source may be prevented from fracture.

According to an EUV source cleaning apparatus, an EUV source cleaning method using the same, and a substrate processing method including the same in accordance with some embodiments of the present inventive concepts, a scraper may be used as an electrode to apply a current during a cleaning procedure. A reaction between solid tin (Sn) and sodium hydroxide (NaOH) may thus be promoted by speeding up the chemical reaction by the use of the scraper applying the electric current.

According to an EUV source cleaning apparatus, an EUV source cleaning method using the same, and a substrate processing method including the same in accordance with the present inventive concepts, an EUV source may be cleaned.

According to an EUV source cleaning apparatus, an EUV source cleaning method using the same, and a substrate processing method including the same in accordance with the present inventive concepts, contaminants PD in an EUV source housing.

According to an EUV source cleaning apparatus, an EUV source cleaning method using the same, and a substrate processing method including the same in accordance with the present inventive concepts, other components may be prevented from fracture in a cleaning procedure of the EUV source.

Effects of the present inventive concepts are not necessarily limited to the mentioned above, other effects which have not been mentioned above will be clearly understood to those skilled in the art from the following description.

Although the present inventive concepts have been described in connection with some embodiments of the present inventive concepts illustrated in the accompanying drawings, it will be understood to those skilled in the art that various changes and modifications may be made without departing from the technical spirit and essential feature of the present inventive concepts.

What is claimed is:

1. A substrate processing method, comprising:
using an exposure apparatus to process a substrate; and
cleaning an extreme ultraviolet (EUV) source of the exposure apparatus,
wherein cleaning the EUV source comprising:
spraying a cleaning solution on an inner surface of a housing of the EUV source;
cleaning the inner surface of the housing; and
aspirating a material produced from the cleaning of the inner surface of the housing,
wherein the housing includes an internal space defined by the inner surface of the housing,
wherein the internal space becomes narrower in a first direction,
wherein the cleaning solution includes sodium hydroxide (NaOH), and
wherein the cleaning of the inner surface of the housing includes using a scraper to scrape the inner surface of the housing and applying electric power to the scraper.

2. The substrate processing method of claim 1, wherein the exposure apparatus includes:
the EUV source;
an optical reflector that reflects EUV radiation generated from the EUV source; and
a substrate stage that supports the substrate.

3. The substrate processing method of claim 1, wherein the scraper is rotatably and slidably supported by a prevention plate in the housing, and the prevention plate is coupled to a height adjustment device.

4. The substrate processing method of claim 1, wherein the scraper includes a first scraper element and a second scraper element,
wherein each of the first scraper element and the second scraper element includes an electrically conductive material.

5. The substrate processing method of claim 1, wherein the cleaning the inner surface of the housing includes using a brush to brush the inner surface of the housing.

6. The substrate processing method of claim 1, further comprising loading the substrate into the exposure apparatus before using the exposure apparatus to process the substrate.

7. The substrate processing method of claim 6, further comprising unloading the substrate from the exposure apparatus before cleaning the extreme ultraviolet (EUV) source.

8. A substrate processing method, comprising cleaning an extreme ultraviolet (EUV) source,
wherein the cleaning the EUV source comprising:
spraying a cleaning solution on an inner surface of a housing of the EUV source;
cleaning the inner surface of the housing; and
aspirating a material produced from the cleaning of the inner surface of the housing,
wherein the housing includes an internal space defined by the inner surface of the housing,
wherein the internal space becomes narrower in a first direction,
wherein the cleaning solution includes sodium hydroxide (NaOH), and
wherein the cleaning of the inner surface of the housing includes using a scraper to scrape the inner surface of the housing and applying electric power to the scraper.

9. The substrate processing method of claim 8, wherein the scraper is rotatably and slidably supported by a prevention plate in the housing, and the prevention plate is coupled to a height adjustment device.

10. The substrate processing method of claim 9, wherein the scraper includes a first scraper element and a second scraper element, wherein each of the first scraper element and the second scraper element includes an electrically conductive material.

11. The substrate processing method of claim 8, wherein the cleaning the inner surface of the housing includes using a brush to brush the inner surface of the housing.

12. The substrate processing method of claim 11, wherein the using the brush to brush the inner surface of the housing includes:

moving the brush in a back-and-forth manner; and moving the brush in a rotational manner.

13. The EUV source cleaning method of claim 8, wherein the aspirating the material produced from the inner surface of the housing includes using an aspiration line to aspirate liquefied tin produced from the inner surface of the housing, and wherein the aspiration line is connected to an aspiration pump.

14. A substrate processing method, comprising:

loading a substrate into an exposure apparatus;

using the exposure apparatus to process the substrate;

unloading the substrate from the exposure apparatus; and cleaning an extreme ultraviolet (EUV) source of the exposure apparatus, wherein the exposure apparatus includes:

the EUV source;

an optical reflector that reflects EUV radiation generated from the EUV source; and a substrate stage that supports the substrate, wherein the cleaning the EUV source includes:

spraying sodium hydroxide (NaOH) on an inner surface of a housing of the EUV source; and cleaning the inner surface of the housing, and wherein the cleaning of the inner surface of the housing includes using a scraper to scrape the inner surface of the housing and applying electric power to the scraper.

15. The substrate processing method of claim 14, wherein the cleaning the EUV source includes aspirating a material produced from the cleaning of the inner surface of the housing.

16. The substrate processing method of claim 14, wherein the scraper is rotatably and slidably supported by a prevention plate in the housing, and the prevention plate is coupled to a height adjustment device.

17. The substrate processing method of claim 16, wherein the scraper includes a first scraper element and a second scraper element, wherein the cleaning the inner surface of the housing includes applying electric power to each of the first scraper element and the second scraper element.

18. The substrate processing method of claim 14, wherein the cleaning the inner surface of the housing includes using a brush to brush the inner surface of the housing.

19. The substrate processing method of claim 14, wherein the using the exposure apparatus to process the substrate includes using the EUV source to emit the EUV radiation to the substrate.

20. The substrate processing method of claim 14, wherein the EUV source includes:

the housing that includes an internal space whose diameter decreases in a first direction;

a collector combined with the housing, the collector reflecting the EUV radiation generated in the internal space; and a laser generator that emits a laser beam to the internal space.

* * * * *